United States Patent
Agraz Huitron et al.

(10) Patent No.: US 11,152,526 B2
(45) Date of Patent: Oct. 19, 2021

(54) FLEXIBLE SYSTEM OF SMALL-SCALE LINEAR PARABOLIC SOLAR CONCENTRATORS FOR POWER GENERATION AND DEHYDRATION

(71) Applicant: INVENTIVE POWER S.A. DE C.V., Jalisco (MX)

(72) Inventors: Aldo Agraz Huitron, Jalisco (MX); Angel Alejandro Mejia Santiago, Jalisco (MX)

(73) Assignee: INVENTIVE POWER S.A. DE C.V., Jalisco (MX)

( * ) Notice: Subject to any disclaimer, the term of this patent is extended or adjusted under 35 U.S.C. 154(b) by 877 days.

(21) Appl. No.: 14/386,525

(22) PCT Filed: Feb. 18, 2013

(86) PCT No.: PCT/MX2013/000022
§ 371 (c)(1),
(2) Date: Jan. 7, 2015

(87) PCT Pub. No.: WO2013/141683
PCT Pub. Date: Sep. 26, 2013

(65) Prior Publication Data
US 2015/0122309 A1    May 7, 2015

(30) Foreign Application Priority Data
Mar. 21, 2012  (MX) .................. MX/A/2012/003407

(51) Int. Cl.
*H01L 31/0525*  (2014.01)
*F24S 23/74*  (2018.01)
(Continued)

(52) U.S. Cl.
CPC ........ *H01L 31/0525* (2013.01); *B01D 1/0082* (2013.01); *F24S 23/74* (2018.05);
(Continued)

(58) Field of Classification Search
CPC .... Y02P 80/24; Y02E 10/45; F24J 2/38; F24J 2/42; F24J 2/541; F24J 2/0023;
(Continued)

(56) References Cited

U.S. PATENT DOCUMENTS 1,556,865 A * 10/1925 Muller ................ F26B 3/286
34/418
1,562,790 A * 11/1925 Rockburg ............ F26B 17/16
34/176
(Continued)

FOREIGN PATENT DOCUMENTS

| CN | 201569253 U | 9/2010 |
| FR | 2927693 A1 | 8/2009 |
| KR | 20100117274 A | 11/2010 |

*Primary Examiner* — Avinash A Savani
*Assistant Examiner* — Martha M Becton
(74) *Attorney, Agent, or Firm* — Lucas & Mercanti, LLP

(57) ABSTRACT

The invention relates to a solar energy collection system that uses linear parabolic concentrators designed on a small scale and with a modular configuration that allows optimum usage of solar collection surface area in places such as the roofs or flat roofs of factories or shops where space is generally small or irregular. The solar collector is coupled in rows actuated by a fully autonomous system for electronically controlling solar tracking, the operation of which is based on an algorithm programmed in a microcontroller. An autonomous solar tracking system can efficiently control two parallel rows with a pre-defined number of solar concentrators, as well as automatically detecting the presence of impurities on a reflecting radiation surface for the maintenance thereof. The thermal energy produced is harnessed by a heat exchanger, the operation of which is based on conduction, convection and radiation for dehydration uses.

15 Claims, 11 Drawing Sheets

(51) Int. Cl.
| | |
|---|---|
| *F24S 30/425* | (2018.01) |
| *H02S 20/10* | (2014.01) |
| *F24S 50/20* | (2018.01) |
| *F24S 23/70* | (2018.01) |
| *H01L 31/054* | (2014.01) |
| *H02S 20/32* | (2014.01) |
| *H02S 40/22* | (2014.01) |
| *B01D 1/00* | (2006.01) |
| *F28D 9/00* | (2006.01) |
| *F26B 23/00* | (2006.01) |
| *F24S 90/00* | (2018.01) |

(52) U.S. Cl.
CPC .............. *F24S 23/82* (2018.05); *F24S 30/425* (2018.05); *F24S 50/20* (2018.05); *F28D 9/00* (2013.01); *H01L 31/0547* (2014.12); *H02S 20/10* (2014.12); *H02S 20/32* (2014.12); *H02S 40/22* (2014.12); *F24S 90/00* (2018.05); *F26B 23/00* (2013.01); *Y02B 10/10* (2013.01); *Y02B 10/20* (2013.01); *Y02E 10/40* (2013.01); *Y02E 10/47* (2013.01); *Y02E 10/52* (2013.01); *Y02P 80/10* (2015.11); *Y02P 80/20* (2015.11)

(58) Field of Classification Search
CPC ........ F24J 2002/0038; F24J 2/055; F24J 2/24; F24J 2/54
See application file for complete search history.

(56) References Cited

U.S. PATENT DOCUMENTS

| | | | | |
|---|---|---|---|---|
| 3,957,029 A * | 5/1976 | Nozik | F24S 80/52 | 126/648 |
| 3,999,536 A * | 12/1976 | Bauer | F24S 10/504 | 126/710 |
| 4,000,734 A * | 1/1977 | Matlock | F24S 23/74 | 126/576 |
| 4,006,260 A * | 2/1977 | Webb | A23B 7/02 | 426/438 |
| 4,038,972 A * | 8/1977 | Orrison | F24S 23/74 | 126/578 |
| 4,045,880 A * | 9/1977 | Steffen | F24S 20/66 | 34/93 |
| 4,078,549 A * | 3/1978 | McKeen | F24J 2/14 | 126/606 |
| 4,099,338 A * | 7/1978 | Mullin | F26B 3/286 | 34/514 |
| 4,122,828 A * | 10/1978 | DiPeri | F28F 9/0263 | 126/671 |
| 4,137,898 A * | 2/1979 | Koizumi | F24D 11/007 | 126/400 |
| 4,202,322 A * | 5/1980 | Delgado | F24J 2/055 | 126/570 |
| 4,221,059 A * | 9/1980 | Everitt | F26B 3/286 | 34/93 |
| 4,240,210 A * | 12/1980 | Huang | C02F 11/12 | 34/520 |
| 4,245,398 A * | 1/1981 | Poisson | F26B 3/286 | 34/93 |
| 4,263,721 A * | 4/1981 | Danford | A24B 1/02 | 34/514 |
| 4,326,499 A * | 4/1982 | Koskela | F24J 2/4634 | 126/588 |
| 4,352,350 A * | 10/1982 | Johnson | F24J 2/08 | 126/579 |
| 4,369,585 A * | 1/1983 | Berkoff | A23N 12/08 | 34/126 |
| 4,391,046 A * | 7/1983 | Pietraschke | F26B 3/286 | 34/93 |
| 4,501,074 A * | 2/1985 | O'Hare | A23L 3/40 | 126/569 |
| 4,644,934 A * | 2/1987 | Kaus | F24D 17/0021 | 126/605 |
| 5,001,846 A * | 3/1991 | Andrassy | F26B 3/286 | 126/586 |
| 5,035,117 A * | 7/1991 | Drake | B01D 53/002 | 62/79 |
| 5,038,498 A * | 8/1991 | Woolsey | F26B 17/08 | 34/203 |
| 5,065,528 A * | 11/1991 | Kaneko | F26B 3/286 | 34/181 |
| 5,193,444 A * | 3/1993 | Bar-Sheshet | A21B 1/26 | 126/21 A |
| 5,584,127 A * | 12/1996 | Sutherland | F26B 3/286 | 126/681 |
| 5,960,560 A * | 10/1999 | Stoll | F26B 3/286 | 34/212 |
| 6,065,223 A * | 5/2000 | Gode | F26B 17/08 | 34/168 |
| 6,438,862 B1 * | 8/2002 | Soucy | F26B 3/286 | 34/135 |
| 6,922,908 B1 * | 8/2005 | Raudales | F26B 3/286 | 126/634 |
| 7,748,137 B2 * | 7/2010 | Wang | A01G 9/22 | 34/396 |
| 8,037,931 B2 * | 10/2011 | Penev | F24D 17/0021 | 126/585 |
| 8,443,795 B2 * | 5/2013 | Kimura | F24J 2/145 | 126/684 |
| 2004/0025366 A1 * | 2/2004 | Soucy | F26B 3/286 | 34/230 |
| 2009/0308566 A1 * | 12/2009 | Simka | F24F 5/0042 | 165/45 |
| 2010/0170500 A1 * | 7/2010 | Zillmer | B01D 53/261 | 126/640 |
| 2010/0186820 A1 * | 7/2010 | Schon | F24J 2/12 | 136/259 |
| 2011/0073104 A1 * | 3/2011 | Dopp | F24J 2/055 | 126/651 |
| 2011/0073149 A1 * | 3/2011 | Ladner | F24J 2/13 | 136/200 |
| 2011/0094502 A1 * | 4/2011 | Reynolds | G02B 19/0042 | 126/684 |
| 2011/0162692 A1 * | 7/2011 | Giacalone | F24J 2/542 | 136/248 |
| 2011/0220096 A1 * | 9/2011 | Margankunte | F24J 2/07 | 126/684 |
| 2011/0259400 A1 * | 10/2011 | Nilsson | H01L 31/0521 | 136/248 |
| 2012/0073567 A1 * | 3/2012 | Winston | B21D 53/02 | 126/652 |
| 2012/0325314 A1 * | 12/2012 | Cheung | H01L 31/0547 | 136/259 |
| 2013/0092153 A1 * | 4/2013 | O'Donnell | F24J 2/05 | 126/600 |
| 2013/0098354 A1 * | 4/2013 | Kummamuru | F24J 2/10 | 126/600 |
| 2013/0112394 A1 * | 5/2013 | O'Donnell | E21B 43/24 | 166/57 |
| 2013/0192585 A1 * | 8/2013 | von Behrens | F24J 2/14 | 126/601 |
| 2013/0247961 A1 * | 9/2013 | Pedretti | F24J 2/05 | 136/248 |
| 2014/0048121 A1 * | 2/2014 | Schwartz | F24J 2/38 | 136/248 |
| 2015/0020408 A1 * | 1/2015 | Weir | F26B 3/286 | 34/522 |

* cited by examiner

FLEXIBLE SYSTEM OF SMALL-SCALE LINEAR PARABOLIC SOLAR CONCENTRATORS FOR POWER GENERATION AND DEHYDRATION

CROSS REFERENCE TO RELATED APPLICATION

This Application is a 371 of PCT/MX2013/000022 filed on Feb. 18, 2013 which, in turn, claimed the priority of Mexican Patent Application No. MX/A/2012/003407 filed on Mar. 21, 2012, both applications are incorporated herein by reference.

DESCRIPTION

Object of the Invention

Energy is one foundation in developed countries, and factories and stores in industrialized societies typically generate energy based on fossil fuels to obtain process heat. Diesel, LPG and natural gas are fuels used in these sectors where companies shall withstand their constant increases and cost volatility.

There are technologies in marketplace for solar energy application within a generation range from 50 to 90° C. with flat-type collectors and vacuum pipes, commonly used for household water heating use. Within a range from 300 to 750° C. or above, solar concentration technologies commonly used for electric power generation through thermal solar plants may be found, located in large and open spaces such as desserts. Within a range from 100 to 300° C. there are limited options for solar energy supply, and this range is typically used by factories or stores in processes such as water heating, steam generation, product and foodstuff dehydration and the like. Said temperature range may be reached by parabolic-linear concentrators which collect solar energy transforming it into useful heat. A special interest application at reported temperature levels (100-300° C.) is solar energy foodstuff dehydration, allowing conservation of vegetables, fruits, grains and other crops in a practical and economical way by not using fossil fuels thereto.

The invention disclosed in this document is a solar concentrator with flexible and modular features allowing easy installation, better usage of available solar collection area, lower costs in logistics and transportation and great flexibility to be installed on roofs or factory and shop areas at ground level. Combined with above mentioned invention, the invention of a highly efficient system for product dehydration provided by application of solar thermal energy and collected by a small scale linear parabolic concentrator is also introduced such as that above disclosed, which transfers energy by three heat transfer modes: convection, radiation and conduction towards a dehydration exchanger. The dehydration system has a high operation temperature and industrial scale production capacity, which is not currently commercially offered by current solar energy products.

Background of Invention

There are currently parabolic-linear concentrators for a number of applications in the market, with an operation based on a linear parabolic mirror moving along a shift axis, tracking the sun path during the day in a North-South or East-West orientation. A thermal receiver is coupled to the concentrator focal line which is typically a tubular element manufactured of coated stainless steel with a selective surface for direct normal irradiation, this receiver pipe is further coated with a glass concentric cylinder which prevents losses by thermal convection. Said collectors are installed in row and column arrangements depending on the power calculated for the generation plant. A high thermal transfer fluid or water is circulated within the receiver, which absorbs the heat power coming from the sun which is reflected by the parabolic mirror, thus transporting energy to a conventional thermodynamic cycle for applications such as electric power generation, process heat, refrigeration or a combination of several processes. The cycle has elements such as hydraulic pumps, turbines, condensers, cooling towers and other devices.

There are currently solar concentration systems for thermal energy generation with process heat applications, however, their use is often restricted for developing countries or for those not having government incentives in terms of renewable energies, which in turn leads to high installation and commissioning costs for the companies. In addition to above problems, manufacturers of these systems impose restrictive demands such as: high costs of engineering, supervision, logistics and maintenance. Quite important to note is that solar concentration technologies currently in the market do not show sufficient flexibility and adaptability in their energy production capacities for a wide range of user requirements; this means that finding a technology with all its features (collector, solar tracking controller and thermodynamic elements) easily adapted to the roofs or installation spaces and to energy demand of several users is complicated. One important limitation regarding to currently available parabolic-linear mirror concentrator systems is that most of them are difficult to install in reduced spaces such as flat-roofs in factories and stores. Usually, it is very common to find installation spaces with little adapted orientations for solar path in small and medium-size companies, and irregularities which make even more difficult to install equipment and a better usage of installation area due to a lack of flexibility and modularity of current technologies in marketplace having already defined physical measures.

Based on above paragraph explanation, it has been identified a need in factories and stores to have a reliable, flexible, modular and low-cost solution for thermal energy generation useful in processes, without suffering the constant cost fluctuation of fossil fuels.

One application of special interest is food product dehydration based on solar energy, allowing conservation of vegetable, fruit, coffee and many other types of crops in a practical and economical way.

Solar concentration technologies have a number of applications due to their efficiency at a high temperature range, where conventional flat collectors do not achieve a proper performance. There are dehydration systems currently using solar energy, which are classified in two types: passive, operating by natural circulation or convection and active, using forced convection for functioning. Both technologies offer a sustainable, hygienic alternative and with sanitary conditions under international standards for food processing, without representing a high cost compared to fossil fuel systems. However, said systems do not have sufficient dehydration capacity for large industrial stocks and their operative temperature hardly reaches 100° C., which results in a lower product dehydration speed and therefore, lower production rates. Coupling of a parabolic-linear mirror concentrator system, suitable for industry installation, for industrial dehydration processes is a feasible solution by supplying suitable temperature ranges for this process by solar energy. It is worth to mention that most of the product dehydration systems, whether by solar energy or fossil fuels, transfer heat to the products to be dehydrated by natural or forced convection, which is not an efficient method of thermal energy use.

DETAILED DESCRIPTION OF THE INVENTION

Figure 1:
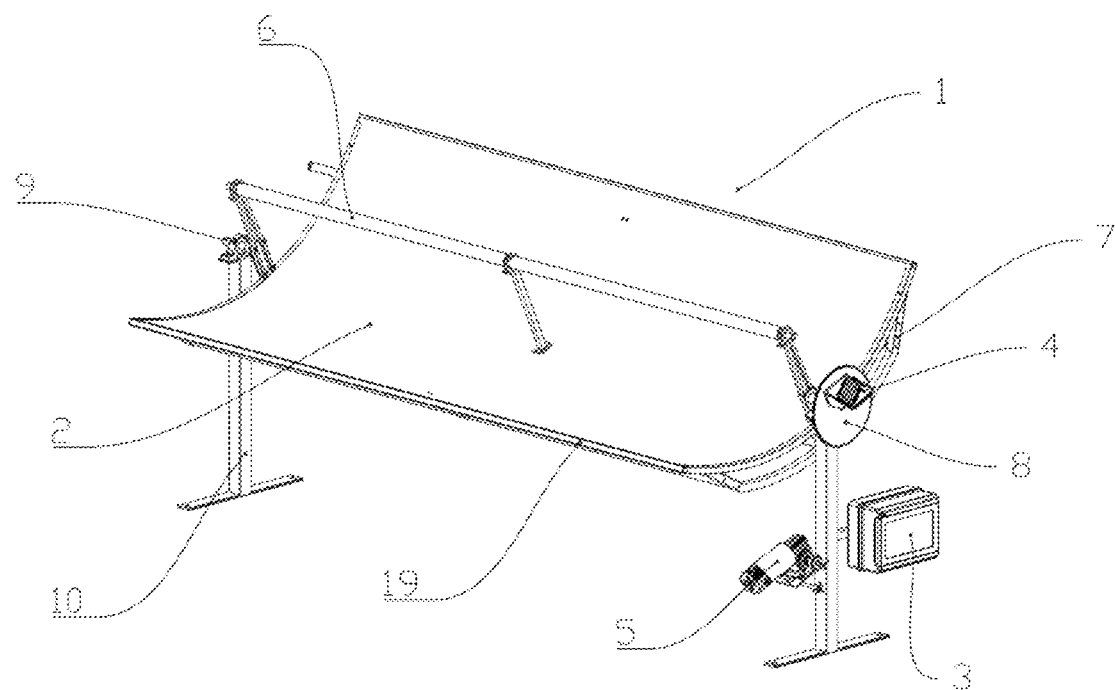
FIG. 1 is an isometric view of a linear parabolic solar concentrator 1, for energy and dehydration generation, comprising a reflective surface 2, a reflecting mirror support structure 19, an electronic control solar tracking system 3, an electromechanical actuator 5, a solar position sensor 4, ribs 7, support masts for each module 10 and a solar radiation receiver 6.
Figure 2:
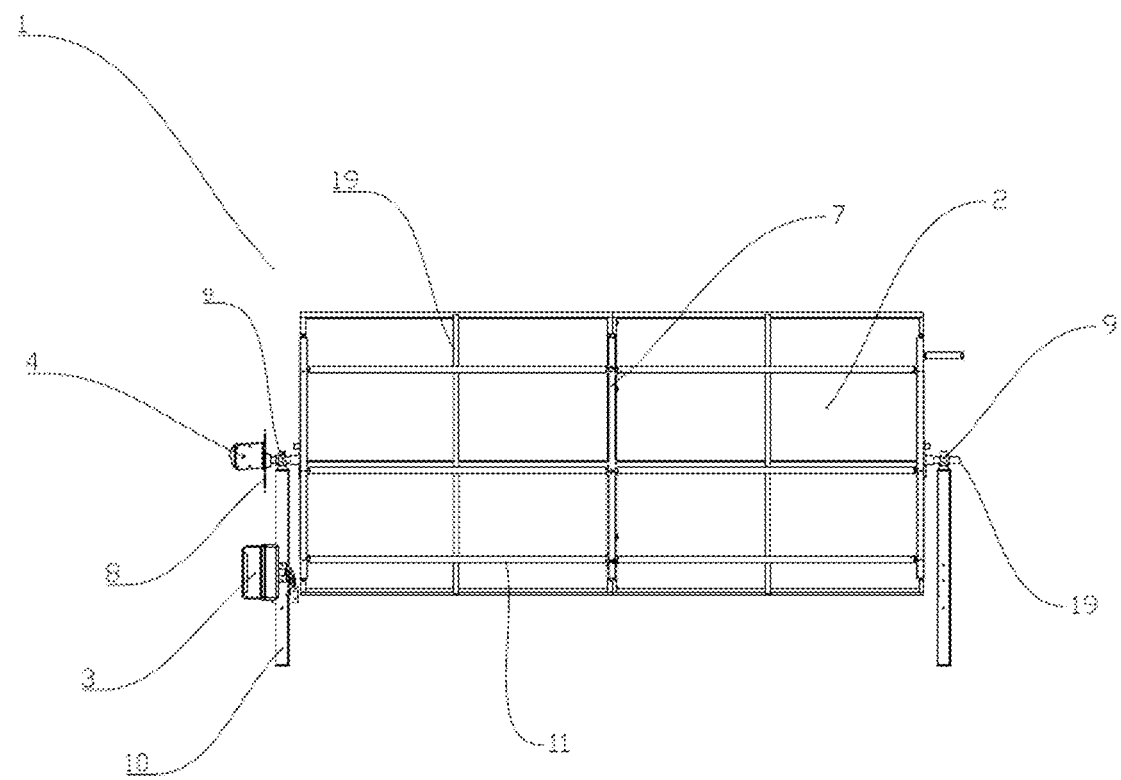
FIG. 2 is a rear view of the linear parabolic solar concentrator 1, where transverse stress supports 11 and ribs 7 are shown.
Figure 3:
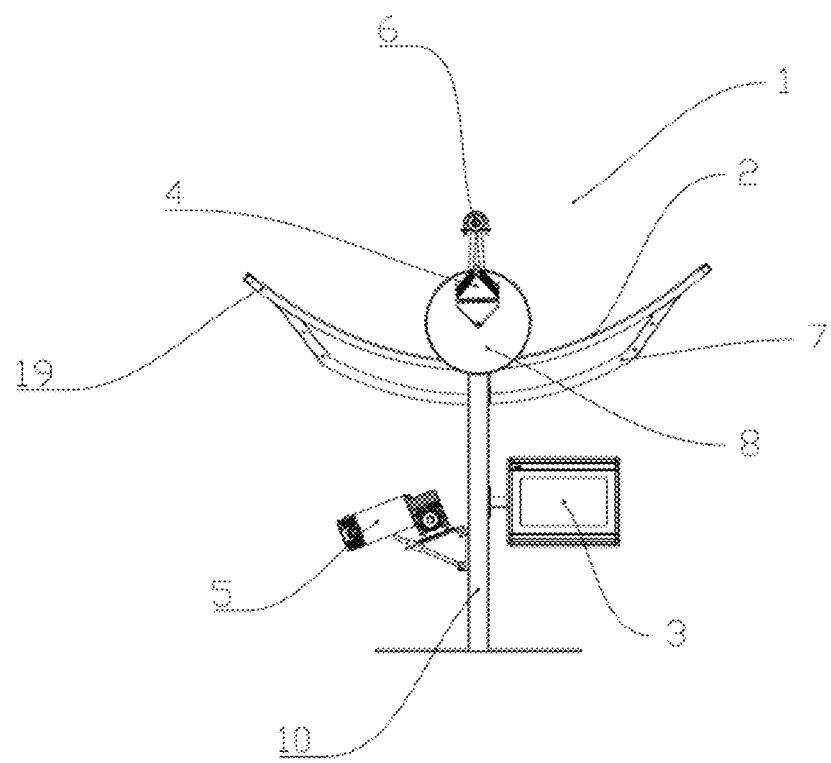
FIG. 3 shows a side view of the linear parabolic solar concentrator.
Figure 4:
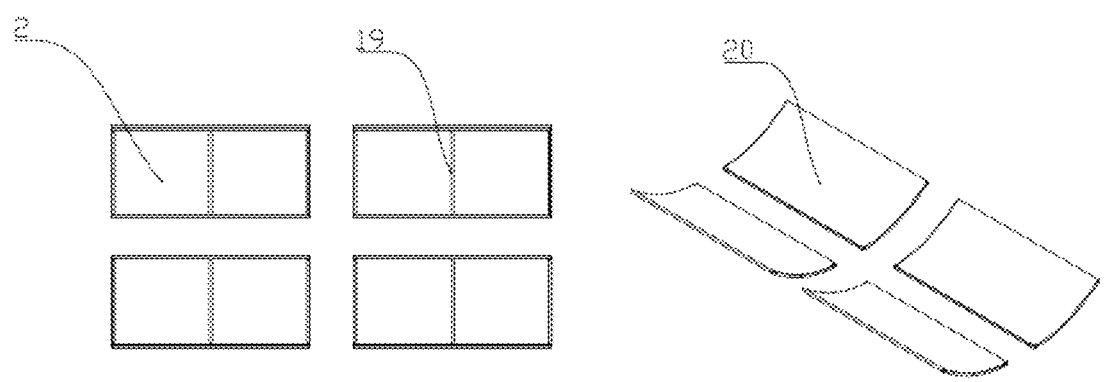
FIG. 4 shows a detailed view of the reflective surface 2, sectioned in equal and symmetrical panels 20 in addition to a reflecting mirror support structure 19 of the reflective surface.
Figure 5:
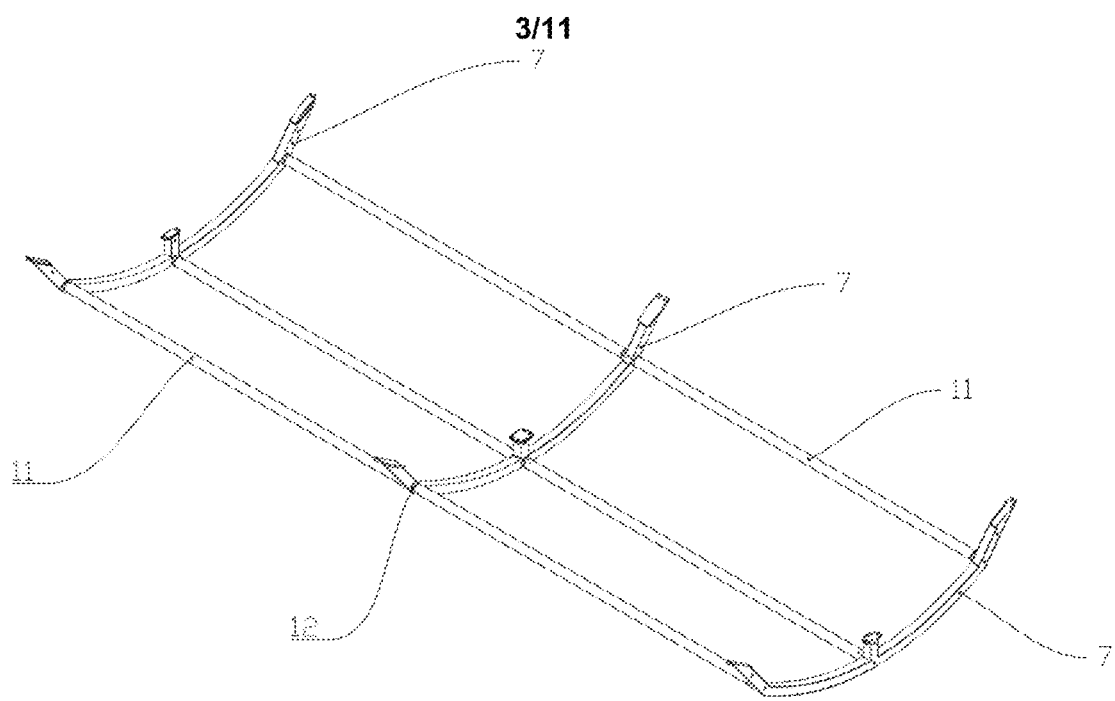
FIG. 5 shows an isometric view of the linear parabolic solar concentrator structural elements consisting of ribs 7 and transverse stress supports 11.
Figure 6:
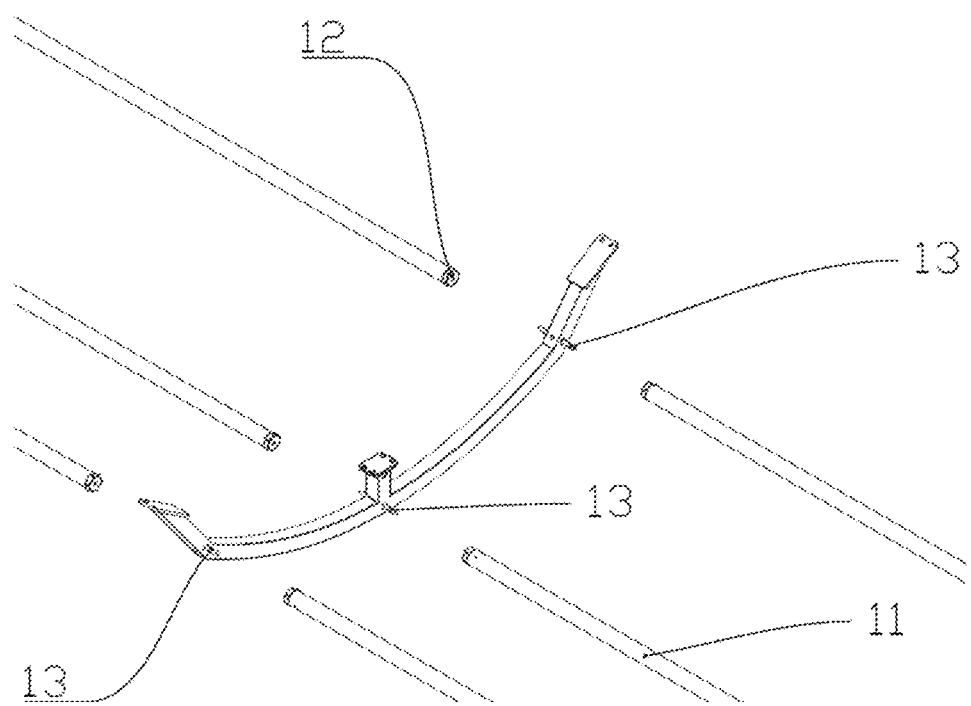
FIG. 6 shows a detailed view of the structural element assembly components consisting of screws 13, which may be threaded bolts in both sides, and inner thread nuts 12.
Figure 7:
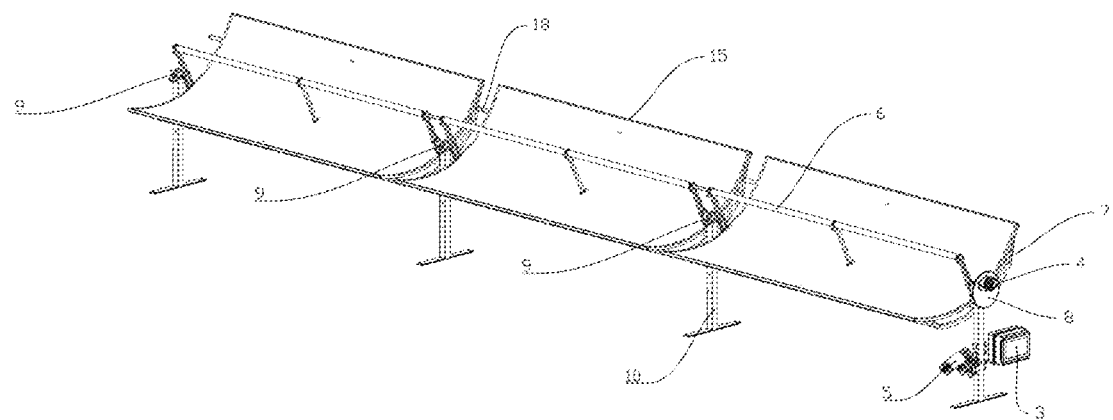
FIG. 7 shows an isometric view of a collector row 15 of serial assembled collectors coupled by spin pivot bearings 9 and alignment pins 18.
Figure 8:
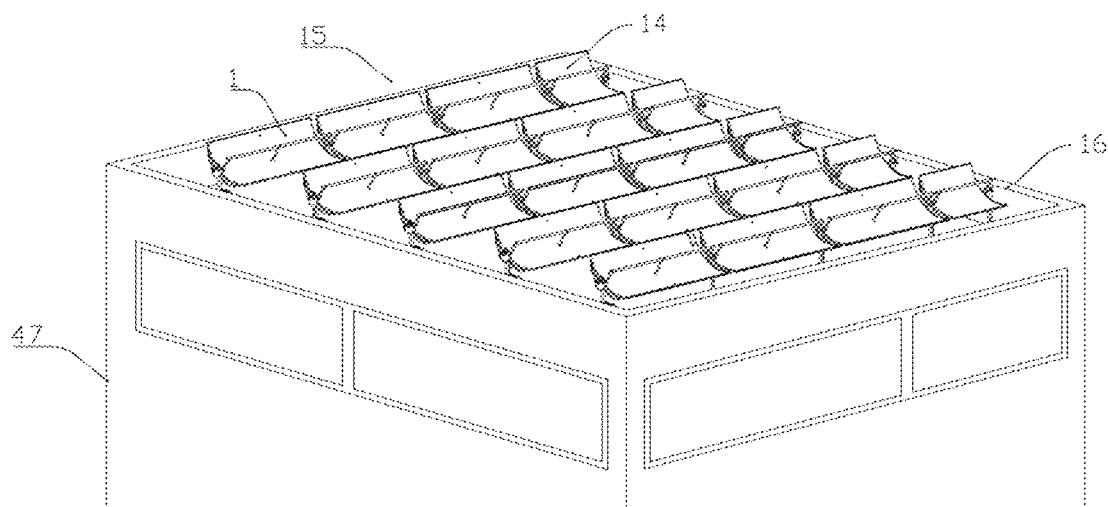
FIG. 8 is a view of several collector rows 15 installed on a building roof 47, the rows consisting of full linear parabolic solar concentrators 1 and halves 14 of a linear parabolic solar concentrator.
Figure 9:
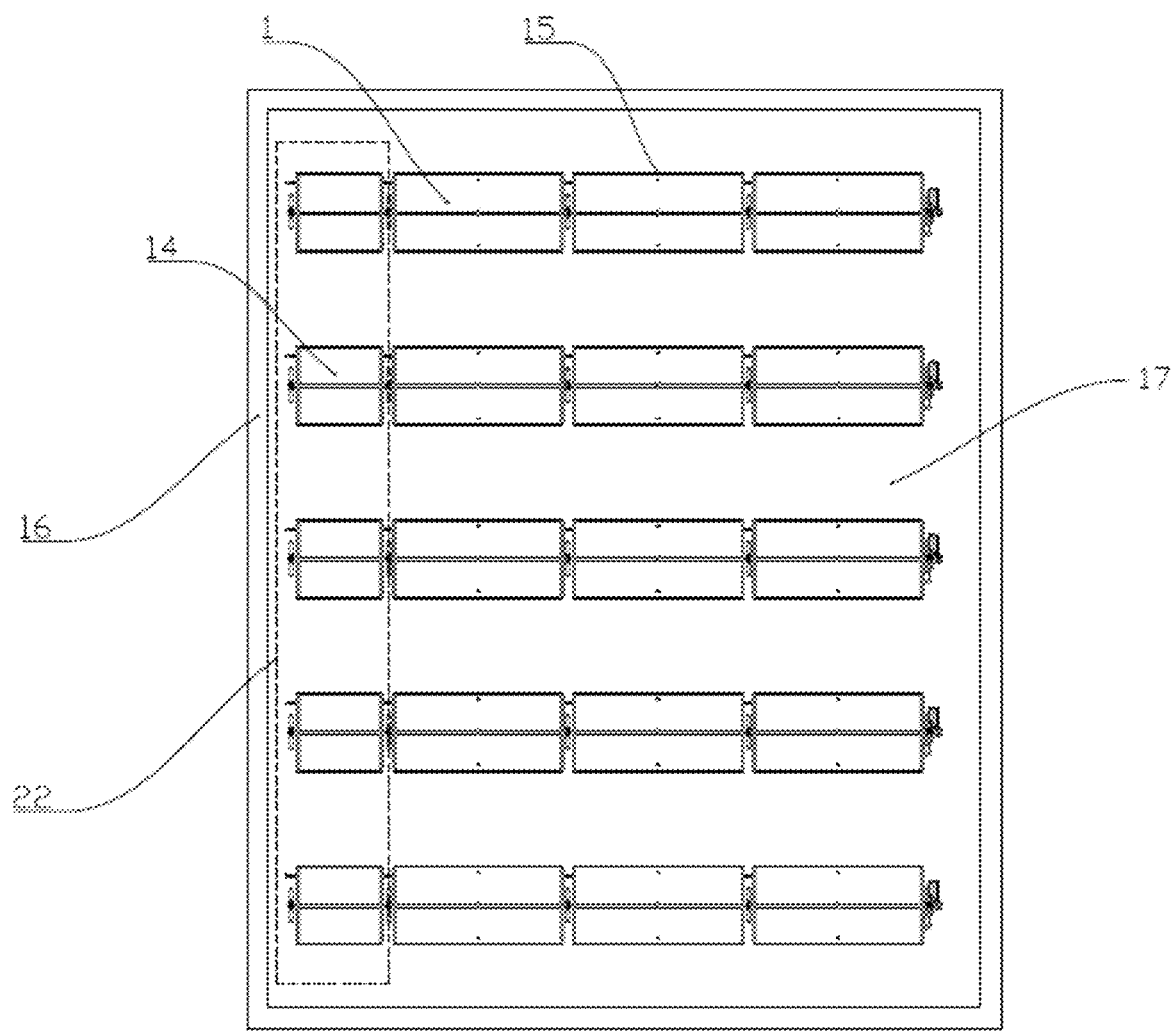
FIG. 9 shows an upper view of the collector rows 15 installed on a building roof or flat roof 17 and surrounded by safety walls 16 used in construction.
Figure 10:
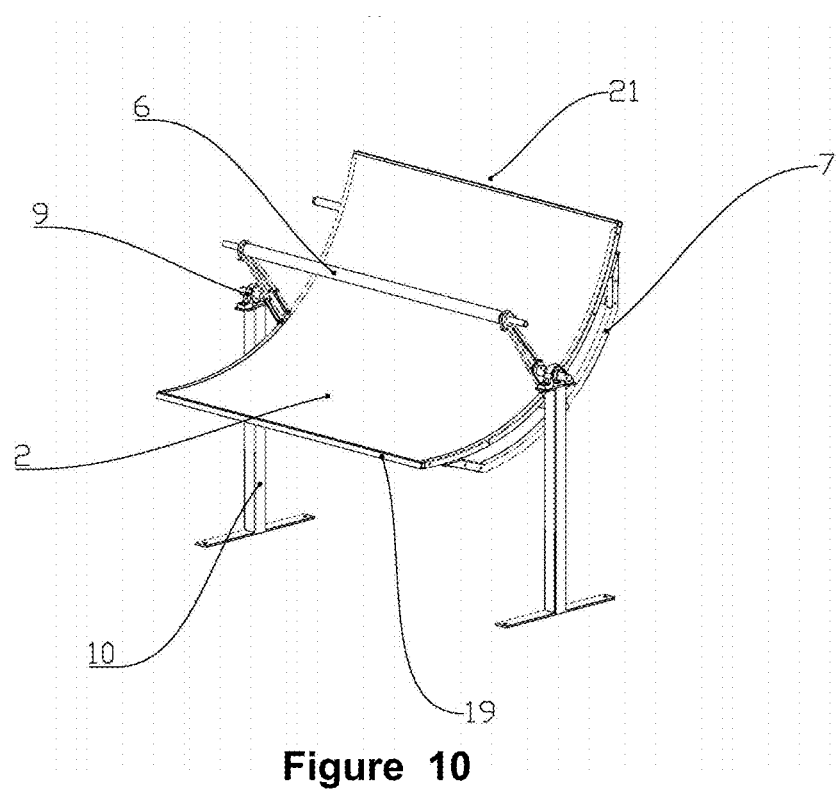
FIG. 10 is an isometric view of a half-section of the linear parabolic collector.
Figure 11:
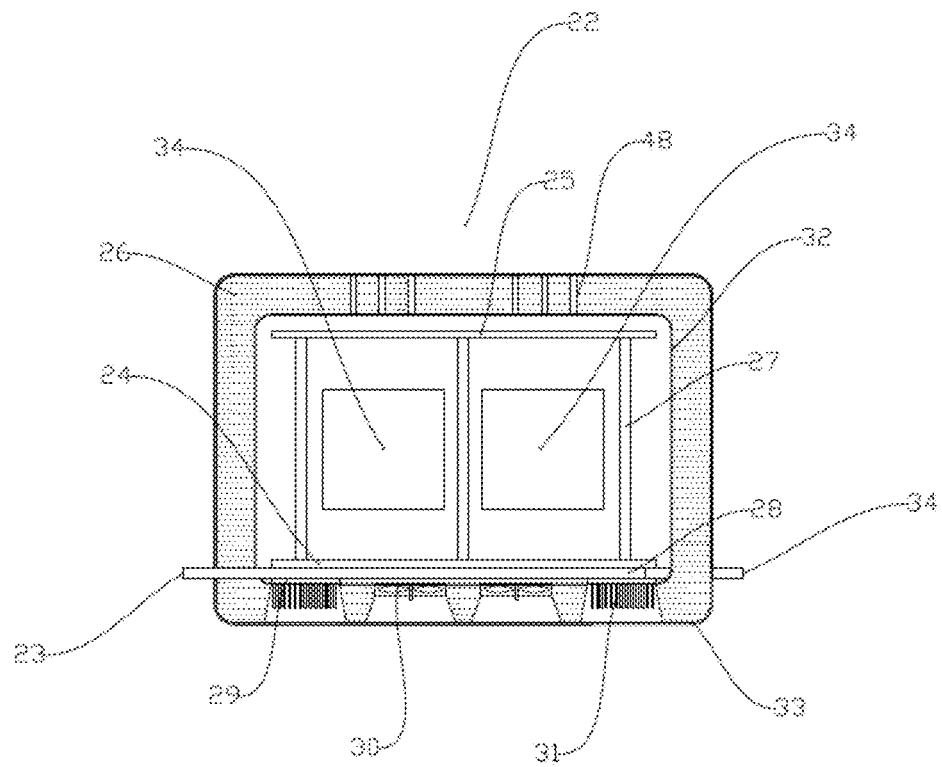
FIG. 11 is a sectioned front view of a tunnel-type modular solar dehydrator 22, whereby a thermal fluid is introduced in a zigzag inlet piping 23, having a fluid outlet 33, a bottom metallic sheet 24 and an upper plate 25 each other transmitting thermal energy by high thermal transfer material 27, which may be heat conductor bars towards an assorted nature product 34 and heat is insulated from outside by an inner protective surface 32 in contact with a thermal insulator 26 and an outer surface 33. Ventilators 30 are also shown as thermal convection actuators, thermoelectric cells 29 as heat-to-electricity transducers and heat sinks 31.
Figure 12:
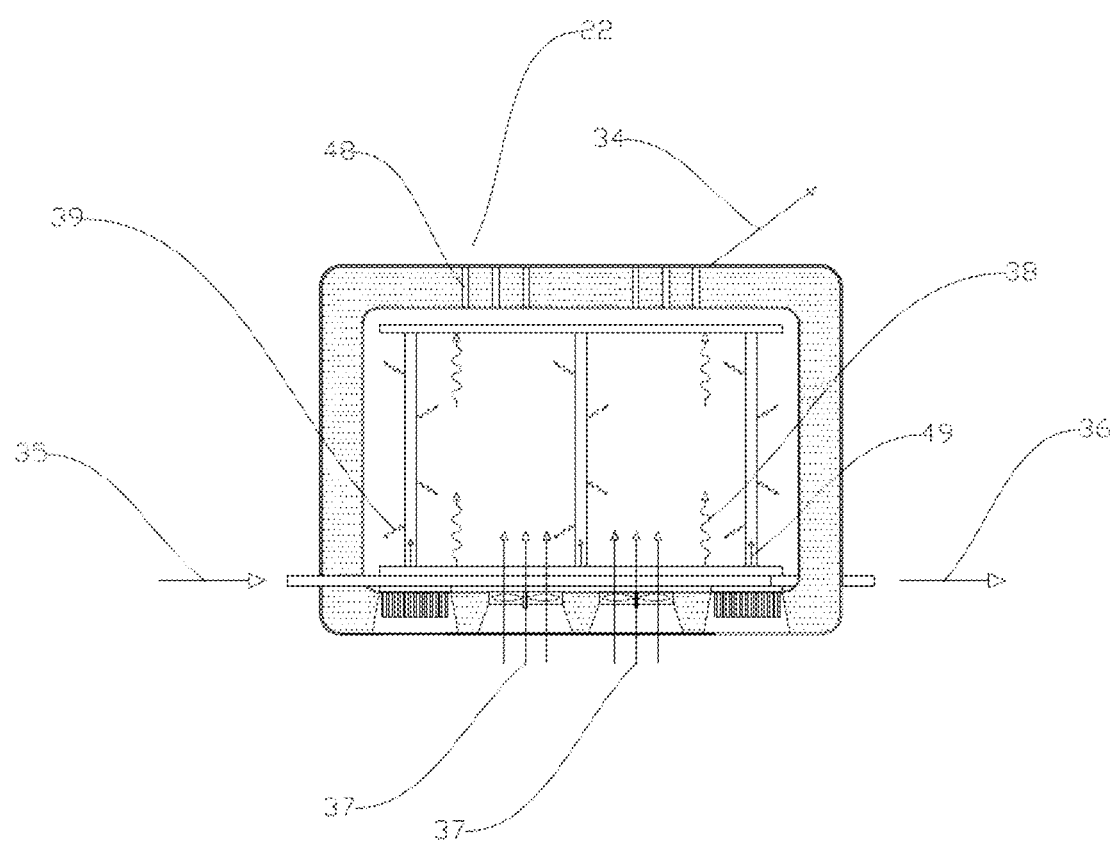
FIG. 12 is another section view of the tunnel-type modular solar dehydrator 22, with schematic drawings of the heat flows involved in product dehydration. Convection heat flow 37, radiation between plates 38, radiation from high thermal transfer material 27, which may be conductor bars, towards surroundings 39 and a heat inlet 35 together with its respective outlet 36 are shown.
Figure 13:
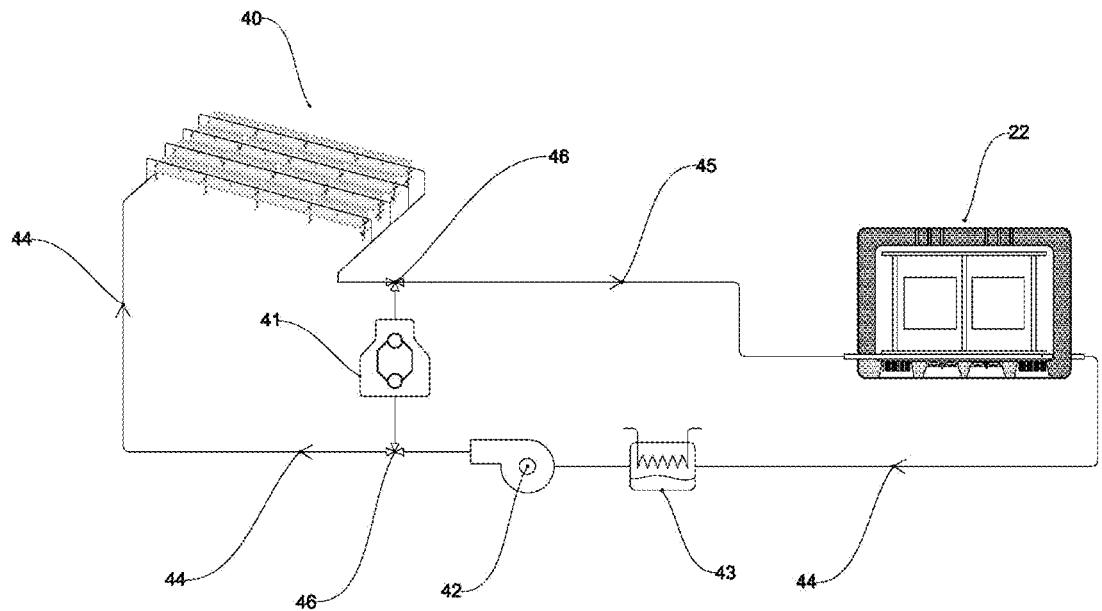
FIG. 13 is a scheme of a thermodynamic circuit comprising a solar collector field 40 in rows and columns coupled to a backup heater 41 using any fossil fuel, a tunnel-type modular solar dehydrator 22, a condenser 43 and a recycle pump 42. A low-temperature thermal transfer fluid 44 is circulated through the components, providing high temperature heat 45 within the tunnel-type modular solar dehydrator 22.
Figure 14:
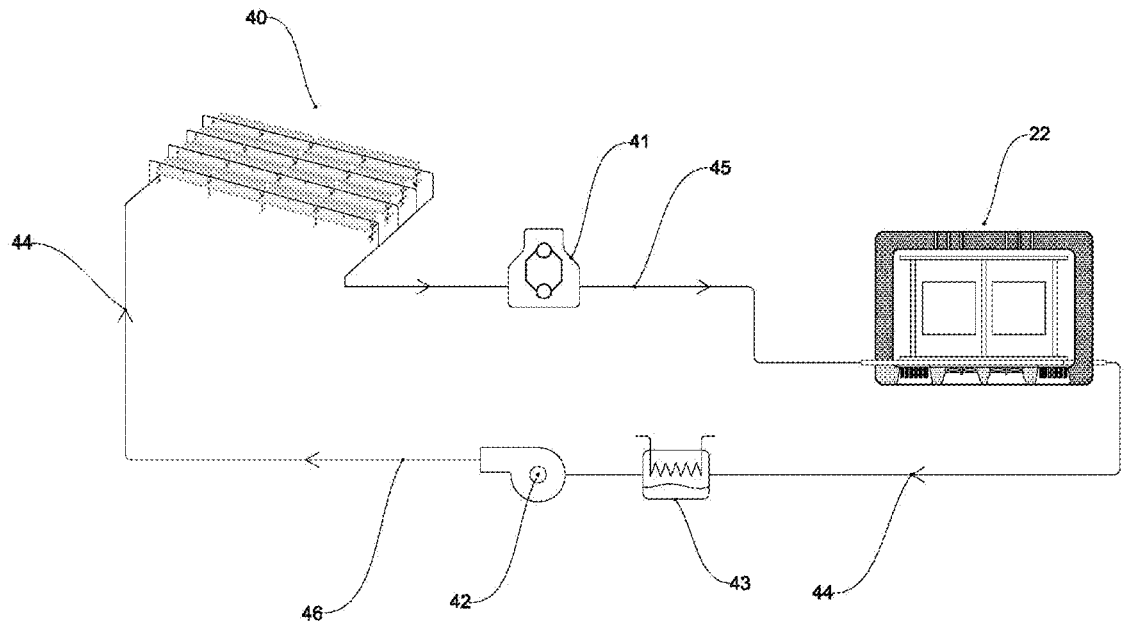
FIG. 14 shows an arrangement wherein a backup heater 41, which may be a boiler or fuel heater functions as pre-heated fluid superheater by solar collector field 40.
Figure 15:
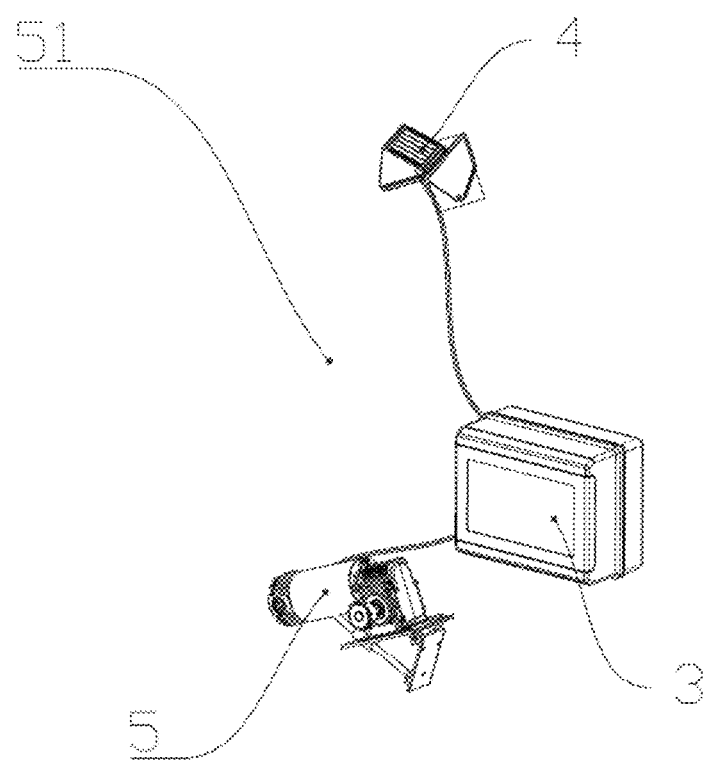
FIG. 15 shows a component assembly for the solar tracking actuator system 51, where an electronic control solar tracking system 3 may be seen which receives luminosity signals proceeding from a solar position sensor 4. The electronic control solar tracking system 3 calculates the required positions of the electromechanical actuator 5 and sends control signals to this last element, therefore the joint mechanism of serial solar collectors (FIG. 7) may rotate by making a solar tracking over a horizontal rotation axis.
Figure 16:
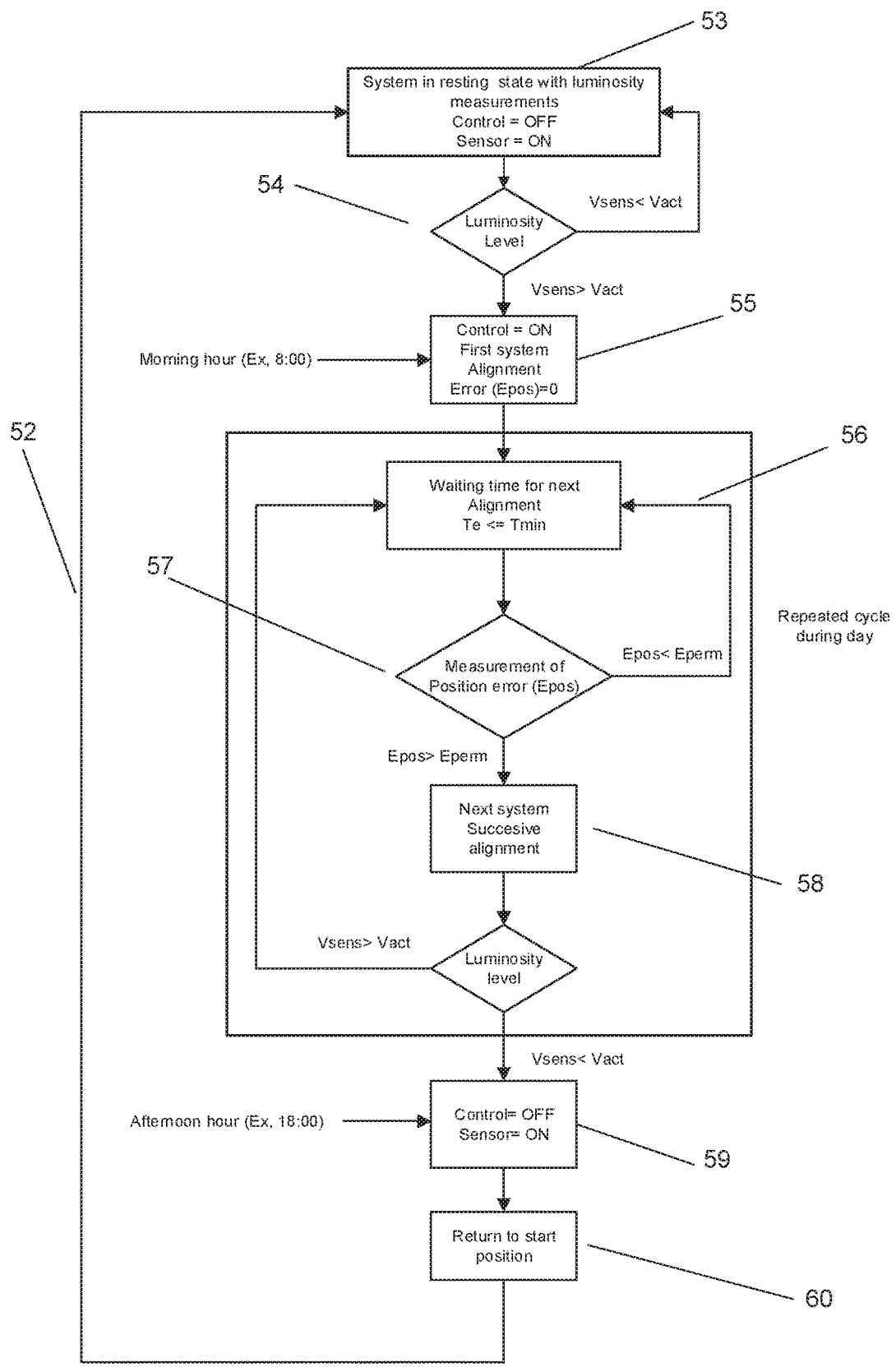
FIG. 16 shows a flow diagram of the algorithm 52 used for solar tracking electronic control.

Linear Parabolic Solar Concentrator.

The present invention consists of a small scale parabolic-linear solar concentrator. Its size and design have been created to be used by a number of factories and stores, providing the easiness to be installed on roofs or company's open areas, allowing adaptability to energy user requirements because of an integral and modular arrangement of the solar tracking collector-controller. Moreover, its flexible design provides a possibility of more usage of installation area thus providing a higher solar energy collection in reduced spaces, without representing a risk for the users due to inclement weather which may be present at the location.

The solar collector performance is based on the parabolic curve principle:

$$y = \frac{x^2}{4f}$$

wherein:
f=Parabolic curve focus point.
x=Horizontal distance from center.
y=Vertical distance.

The parabolic curve is extruded to create a channel or concave shape surface sectioned in symmetrical panels 20, assembled by aluminum or steel metallic profiles (but not limited to these materials) which limit the panel outline and comprise structural crossbars providing higher stiffness to each piece of reflecting mirror support structure 19. A reflective surface 2 based on aluminum sheet (not restricted to this material) with a highly reflective sunlight mirrored finish is adhered to the panel frame by fastening elements such as screws, rivets or special adhesives. A suitable reflective material consists of a mirrored-finishing aluminum sheet coated with an anodized surface suitable to support weather exposure during extended periods. It is also possible to use a polymeric film reflective material with silver coating, laminated with pressure-sensitive adhesive over a metallic or plastic sheet. There is also a possibility to use an acrylic-base reflective material coated with a reflective coating, which allows to be molded according to the intended geometric shape.

In order for the concentrator to be capable of supporting wind loads which have an impact on its surface without showing any deformation, the concentrator has elements providing stiffness upon compression and further upon stress being present during weather phenomena, then ribs 7, which include a curved structure, is included, providing high compressive strength and parabolic curve mechanical expansion and attached each other by several transverse stress supports 11, which may include tubular elements, providing excellent tensile strength and transverse compression to the solar collector. Transverse stress supports 11, which may include crossbars, are fastened with ribs 7 by inner thread nuts 12 and screws 13 for easy assembly.

One of the main properties of the solar concentrator is its modularity for system design and installation with a number of power generation capacities, serially coupled, where one to eight modules in a collector row 15 may be arranged attached each other by rounded spin axes supported over spin pivot bearings 9 allowing solar tracking spin motion throughout a day in a North-South or East-West axis. A power transmission comprising electromechanical actuator 5, which may include a direct current electric motor (not restricted to this type) coupled to an endless screw arrangement and a helical gear allows torque increase and motion interlock when the motor is not energized. The transmission system 8 also includes a set of coupled pinions increasing the transmission ratio, thus achieving a slower and more accurate solar tracking motion.

A solar radiation receiver 6 which collects parabolic mirror thermal energy is positioned in the parabolic curve focal point, which is capable of absorbing said energy by a copper or stainless steel cylindrical pipe (not limited to these materials) with a highly absorbent selective surface for solar irradiation; a second borosilicate or glass pipe is concentrically arranged to the metallic pipe with a high transmissivity index and low reflectivity to solar radiation, thus lowering those convection losses caused by wind.

Solar Tracking Electronic Control System.

A electronic control solar tracking system 3 actuates electromechanical actuator 5, which may be an electric motor (this unit being expansible to a second motor) and achieves keeping the solar concentrator orientation throughout the day towards the maximum possible irradiation amount. The solar monitoring or tracking system operates on alternating current basis at 120V (not restricted to this voltage), which may be directly supplied by the utility company or by any solar to electric power conversion system such as photovoltaic panels. The electronic controller uses a position control algorithm 50 programmed in a semiconductor element called microcontroller, which is capable of performing calculations to compensate system position based on voltage difference readings, provided by the solar position sensor 4, which may be a pyramidal-array photoelectric sensor. The algorithm has been specially conceived for functioning with the disclosed mechanical system and is the element which provides intelligence and solar energy collection autonomy to the system, on the opposite side, the mechanical system is useless without this control algorithm. The electronic control solar tracking system 3 together with its components; solar position 4, control card with microcontroller and supply and measurement connections comprise a single component integrating a solar tracking actuator system 51 which is easy to install, calibrate and arrange in a small size linear parabolic solar concentrator 1 (not restricted to this type of collector, dish-type solar collectors or photovoltaic systems may be adapted among applications requiring a high accuracy and automatic active solar monitoring).

Figure 17:
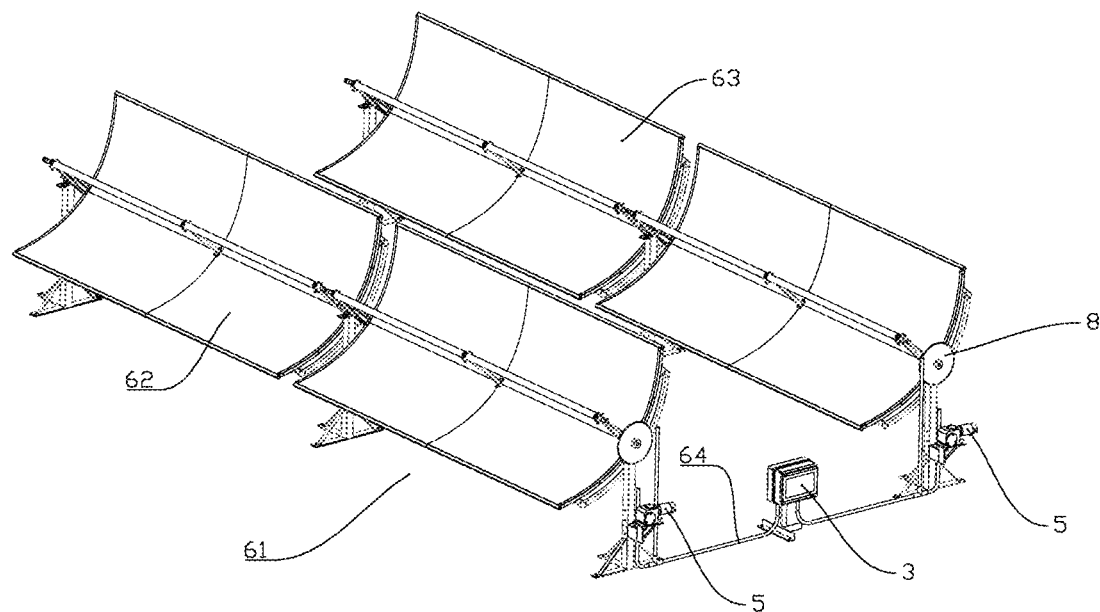
FIG. 17 shows an arrangement 61 of two solar concentrator rows together with a electronic control solar tracking system 3.
Figure 18:
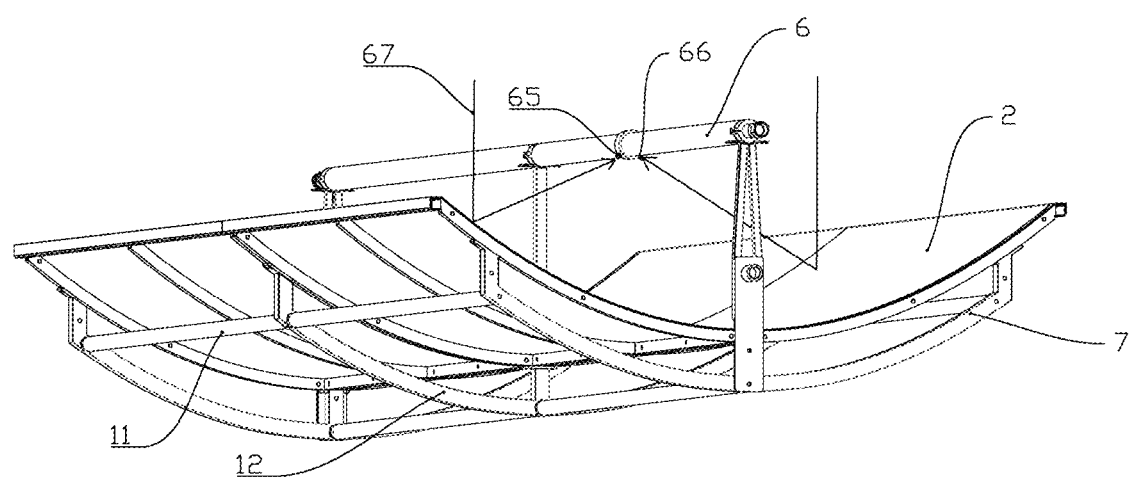
FIG. 18 shows an arrangement of two detection elements or temperature sensors which may be also solar luminosity sensors 65 and 66, detecting light intensity or energy amount incident on its surface and sending a notice signal to the user, so that he may provide a proper cleaning to the reflective surface 2 of the solar concentrator.

The electronic control solar tracking system 3 may be installed in a two-row solar collector arrangement 61 as shown in FIG. 17, the control module 3 has the capacity to receive signals proceeding from a row of up to ten solar concentrators 62 and another row of solar concentrators 63 equally in parallel, each with a solar position sensor 4 (which may include a solar luminosity sensor) indicating an ideal position in a determined time of the day for each of the rows. Once the electronic control solar tracking system 3 calculates the ideal position of each of the two collector rows, transmits electric control signals to the electromechanical actuators 5 located in the motion transmission system 8 of each collector row. This dual arrangement of solar tracking control allows reducing system's manufacturing costs and cutting installation and commissioning time for the solar concentration system.

The solar tracking control system includes two temperature or solar luminosity sensors 65 and 66, located on the solar radiation receiver 6, these sensors detect a temperature or light intensity difference and they send signals as a second feedback towards the electronic control solar tracking system 3. The solar luminosity sensors 65 and 66 located in the solar receiver also act as soil or impurity detection instruments on the reflective surface 2 of the linear parabolic solar concentrator 1, this function allows correct detection when system demands maintenance and cleaning on the reflective surface 2 and thus system performance is optimal during useful life with a lower maintenance cost.

Solar Tracking Electronic Control Algorithm

The system starts in a rest state 53 performing solar luminosity measurements. When the system detects that light intensity is sufficient to start conducting an alignment routine 54 it then goes into a first alignment stage, or the solar position control 55 is turned on. Once that the system is aligned by carrying the position error at zero level, the algorithm enters into a continuous alignment error measurement cycle 57 and controls the solar collector position throughout the day. As sun's apparent motion reaches sunset and nighttime luminosity level 59 is detected, the algorithm leaves the control cycle and enters into a return status to the solar collector initial position 60 where kept ready and in a rest state 53 starting again the following day with the algorithm 52.

Solar Dehydration System

The solar dehydration system consists of an exchanger operating in three available heat transfer modes: conduction, convection and radiation. Said exchanger consists of a thermal chamber manufactured with metallic materials 32 (not limited to these materials) and coated with a refractory or thermal insulator 26, which includes insulating material preventing heat losses outside. An arrangement of zigzag piping is located within this chamber 28 said piping made of copper or stainless steel (not restricted to this material) wherein steam or a high thermal transfer oil is circulated, the piping arrangement conducts heat to a metallic sheet 24 made of copper, carbon steel or stainless steel (not limited to these materials), which in turn is interconnected to an upper plate 25, which is parallel to metallic sheet 24 and is located in the opposite side of the exchanger, by a high thermal transfer material 27 such as copper, steel or graphite bars (not limited to these materials). The dehydrator or exchanger has also ventilators 30 producing a forced outside-to-inside air convection, causing in this way a hot air regular flow 37 with an outlet in system's upper section. The operation principle of this dehydrator consists of heat transfer by thermal conduction from piping to parallel plates, which in turn transfer heat to the product to be dehydrated by convection produced by ventilators 37, and radiation heat transfer between the two plates 38 caused by a temperature difference among them and also radiation between the conductor bars and their surroundings 39. The use of electric power is required in order to lead to a forced convection with the ventilators, which often is not easily available in and agricultural environment, then the system has thermoelectric cells 29 located on the lower temperature plate side which in turn is connected to the outer side by heat sinks 31. Cell performance consists of absorbing the heat from said plate, transforming it into electric power due to a temperature difference between dehydrator inner and outer sides, so that electric power is used and ventilators which produce forced convection are actuated. The dehydration system is modular and may be serially interconnected with identical systems until reaching the required thermal capacity for dehydration.

In order to achieve high temperatures within the dehydrator chamber, this is interconnected with an solar collector field 40 which heat the thermal fluid and optionally further to a backup heater 41 with any fossil fuel such as diesel, LPG, natural gas, and the like, thus supplying sufficient energy according to the required operative conditions.

Having described sufficiently my invention, we consider it as novel and therefore claim as my exclusive property the content in the following clauses:

1. A power generation and dehydration system comprising:
   at least one linear parabolic solar concentrator comprising:
   a) a surface having a form of a selected parabola, the surface comprising at least one first panel and at least one second panel, the first panel having a first shape, the second panel having a second shape, the first and second panels being symmetric, wherein the at least one first panel and the at least one second panel define the selected parabola when joined together;
   b) a mirror mounted on each of the panels and fastened by a plurality of fastening elements;
   c) at least two curve support arcs adapted to provide stiffness to the surface upon wind impact;
   d) a plurality of cross tubular elements, each other joined with the support arcs by fastening means;
   e) a solar concentrated radiation receiver element comprising a cylindrical pipe coated with a selective surface responsive to solar radiation and a transparent pipe concentric with the cylindrical pipe, the transparent pipe being adapted to protect the cylindrical pipe from convection losses; and
   f) a solar tracking electronic control module based on photovoltaic cells having a solar tracking algorithm embedded in a microcontroller, and wherein the system is coupled with an electromechanical actuator keeping the collector position towards the sun rising angle at any time, and
   g) at least one sensor adapted to: detect one of a temperature and a light intensity difference and send signals as a second feedback towards the solar tracking electronic control module; and
   a dehydration system consisting of a heat exchanger for product dehydration interconnected with at least one linear parabolic solar concentrator the heat exchanger comprising:
   a piping arrangement adapted to conduct heat; a thermal chamber insulated from an environment;
   a metallic sheet proximate the piping arrangement the metallic sheet adapted to absorb heat from the piping arrangement a plate located in the chamber, the plate being parallel to the metallic sheet;
   a plurality of bars formed of a selected material having thermal transfer properties, the plurality of bars disposed between the metallic sheet and the plate, the plurality of bars separating the plate from the metallic sheet by a selected distance, the plurality of bars adapted to conduct heat from the metallic sheet toward the plate;
   wherein the metallic sheet, the plate, and the plurality of bars are adapted to radiate heat toward a location between the metallic sheet and the plate;
   at least one ventilator comprising a forced convection system, the at least one ventilator being adapted to produce a constant air flow within the chamber; and
   at least one thermoelectric cell adapted to absorb heat from the plate and transform it into electric power due to a temperature difference between inner and outer sides of the dehydrator to provide electric power to actuate the at least one ventilator;
   wherein said thermal chamber is interconnected to a heating backup system housing a fossil fuel, the heating backup system adapted to heat the fluid at high temperatures and supplying sufficient energy to the heat exchanger; and
   dehydration system is modular and may be serially interconnected with identical systems to achieve a desired thermal capacity for dehydration.

2. The system according to claim 1, comprising a serial coupling of a plurality of linear parabolic solar concentrators, forming a row of linear parabolic solar concentrators in a North-South or East-West orientation, which are coupled to each other by bearing supported axes providing a 180° angular motion and forming a row arrangement allowing flexible scale up/down of the solar energy collection capacity.

3. The system according to claim 2, comprising a mechanical transmission system comprising:
   a direct or continuous current electric motor with endless screw reduction and helical gear; and
   a set of pinions and chain as transmission elements to the angular motion input actuator.

4. The system according to claim 1, which is coupled to an electronic control module for solar tracking comprising:
   a) a photoelectric sensor in a pyramid-type arrangement with at least two photocells or phototransistors located one after another, measuring a voltage differential signal and determining the direction and amount of solar collector motion;
   b) a photocell capable of detecting the solar radiation level depending on day's hour;
   c) an electronic control device based on a microprocessor or microcontroller and power elements calculating the control signals sent to the angular motion electric actuator;
   d) an algorithm embedded in the electronic control device governing the solar tracking control and electronic system performance.

5. The system according to claim 4, wherein the solar irradiation sensor is expanded to a second motion axis by the use of two more cells in the same arrangement.

6. The system according to claim 1, replicated an undefined number of times in row and column arrangements, and interconnected with a heat exchanger allowing heat transfer by forced convection for product dehydration.

7. The system according to claim 6, further comprising a recycle pump and a condenser.

8. The system according to claim 6, which is mechanically connected to several equivalent serial modules forming a dehydration tunnel with dehydration power capacity.

9. The system according to claim 1, which is coupled to a sensor located in the solar radiation receiver, said sensor adapted to detect a temperature or light intensity difference and transmit a signal to the solar tracking electronic control module, the sensor being further adapted to detect an impurity such as dust or soil on the mirror.

10. The system according to claim 9, further comprising one or more rows of linear parabolic solar concentrators, each respective row comprising a serial coupling of a plurality of linear parabolic solar concentrators, wherein the temperature or solar luminosity sensors transmit, to the solar tracking electronic control module, signals to be used as feedback by the solar tracking electronic control system, the signals indicating an ideal position at a determined time of day for each respective row.

11. The system according to claim 1, wherein the fastening means comprise screws and threaded bars.

12. The system according to claim 1, wherein the transparent pipe is made of one of borosilicate and glass.

13. The system according to claim 1, further comprising assembly means allowing housing of a plurality of solar collector geometries.

14. The system according to claim 1, which is installed and coupled with a plurality of solar concentrators in two parallel rows, wherein each of the rows is individually controlled by a single solar tracking electronic control module, the control module adapted to receive signals from a solar luminosity sensor located at each of the two rows and send control signals to the two electromechanical actuators controlling the solar tracking angular motion of each row.

15. The system according to claim 1, which includes a product automatic transportation system, allowing moisture removal.

* * * * *